(12) United States Patent
San Antonio et al.

(10) Patent No.: US 7,700,414 B1
(45) Date of Patent: Apr. 20, 2010

(54) METHOD OF MAKING FLIP-CHIP PACKAGE WITH UNDERFILL

(75) Inventors: Romarico Santos San Antonio, Batam Island (ID); Anang Subagio, Batam Island (ID); Glenn Macaraeg, Graz (AT); Mary Jean Bajacan Ramos, Alessandrea (SG)

(73) Assignee: Unisem (Mauritius) Holdings Limited, Port Louis (MU)

( * ) Notice: Subject to any disclaimer, the term of this patent is extended or adjusted under 35 U.S.C. 154(b) by 63 days.

(21) Appl. No.: 11/709,403

(22) Filed: Feb. 22, 2007

(51) Int. Cl.
*H01L 21/00* (2006.01)
*H01L 21/46* (2006.01)
*H01L 21/44* (2006.01)

(52) U.S. Cl. .................. 438/118; 438/127; 438/456; 438/458; 438/612; 257/E23.131

(58) Field of Classification Search ......... 438/106–127, 438/455–459, 612–617; 257/E23.131
See application file for complete search history.

(56) References Cited

U.S. PATENT DOCUMENTS

| 4,897,508 | A | 1/1990 | Mahulikar et al. |
| 4,965,227 | A | 10/1990 | Chang et al. |
| 5,399,805 | A | 3/1995 | Tyler et al. |
| 5,477,008 | A | 12/1995 | Pasqualoni et al. |
| 6,369,449 | B2 | 4/2002 | Farquhar et al. |
| 6,573,592 | B2 | 6/2003 | Bolken |
| 6,756,251 | B2 * | 6/2004 | Lee .............................. 438/108 |
| 6,933,221 | B1 | 8/2005 | Jiang |
| 6,963,142 | B2 | 11/2005 | Bolken |
| 2003/0042617 | A1 * | 3/2003 | Lee .............................. 257/778 |
| 2004/0004294 | A1 * | 1/2004 | Hall et al. ..................... 257/783 |
| 2004/0197959 | A1 * | 10/2004 | Ujiie et al. .................. 438/118 |
| 2004/0214370 | A1 * | 10/2004 | Quinones et al. ............ 438/106 |
| 2006/0138643 | A1 * | 6/2006 | Lu et al. ...................... 257/706 |

* cited by examiner

*Primary Examiner*—Hsien-ming Lee
*Assistant Examiner*—Kevin Parendo
(74) *Attorney, Agent, or Firm*—Wiggin and Dana LLP

(57) ABSTRACT

A method for the manufacture of a package to encapsulate at least one integrated circuit device includes the steps of: (1) providing a dielectric substrate having a first plurality of bond pads formed on a first side thereof and at least one aperture; (2) electrically interconnecting the integrated circuit device to the plurality of bond pads forming a substrate/integrated circuit device assembly; (3) gravitationally aligning the substrate/integrated circuit assembly such that the integrated circuit device is lower than said substrate; (4) introducing a volume of a low viscosity dielectric into the at least one aperture, wherein the volume is effective to coat a surface of the integrated circuit device and substantially fill the at least one aperture; and (5) encapsulating the integrated circuit device and the first side of said substrate with a dielectric polymer.

12 Claims, 2 Drawing Sheets

METHOD OF MAKING FLIP-CHIP PACKAGE WITH UNDERFILL

CROSS REFERENCE TO RELATED APPLICATION(S)

This application claims the benefit of Non-Provisional application Ser. No. 11/705,318, filed on Feb. 12, 2007 entitled "Method of Making Flip-Chip Package with Underfill" and Provisional Application No. 60/773,269 filed on Feb. 14, 2006, entitled "Method of Making Flip-Chip Package with Underfill", both of which are incorporated by reference in their entirety herein.

U.S. GOVERNMENT RIGHTS

Not Applicable

BACKGROUND OF THE INVENTION

1. Field of the Invention

This invention relates to a method for the manufacture of a package to encapsulate an integrated circuit device. More particularly, a chip-scale package is manufactured by flip-chip bonding input/output pads on the integrated circuit device to bond pads on a substrate. The substrate further includes at least one aperture to enable the introduction of a low viscosity dielectric between the substrate and the integrated circuit device. The bonded assembly is then encapsulated in a molding resin.

2. Description of the Related Art

One package for encapsulating integrated circuit devices such as silicon-based semiconductor dice is the flip chip package. In this package, a semiconductor die has bumped bond pads on an active surface which are soldered to a matching array of bond pads on a substrate. The semiconductor die and attached surface of the substrate are then encapsulated in a molding resin. The molding resin, typically a thermosetting epoxy, is applied at a relatively high temperature and velocity and could damage the semiconductor die or solder interconnects on impact. Typically, an underfill of a fluid epoxy is disposed between the semiconductor die and the substrate to protect the flip chip bonds and circuitry during encapsulation with the molding resin.

Typically, the underfill is dispensed along one or two sides of the die at an elevated temperature to reduce viscosity and facilitate the underfill material flowing quickly between the semiconductor die and the substrate. This method has poor control of the spread of the underfill material and it is necessary for there to be up to three millimeters of clearance between the perimeter of the semiconductor die and the edge of the substrate to accommodate the underfill flow. As a result, the length and width of the semiconductor package cannot be smaller than six millimeters plus the length and width of the semiconductor die. This is a significant increase in occupied real estate over chip scale packages where the perimeter of the package is intended to approach the perimeter of the semiconductor die. Since air pockets are typically trapped between the integrated circuit and the substrate, the method is also prone to incomplete fill and voids that impact reliability. Voids or incomplete fill could also occur due to the limited space between the semiconductor die and the substrate.

While it is known to use vacuum assisted molding, this is an expensive process and requires the use of molded compounds having a fine filler, on the order of less than 50 microns, to fill in the gap between the semiconductor die and substrate.

U.S. Pat. No. 6,573,592 to Bolken discloses a flip chip semiconductor package in which the substrate includes side walls to control the flow of underflow material. The underfill material is introduced along the perimeter of the semiconductor die.

U.S. Pat. No. 6,369,449 to Farquhar, et al. discloses a flip chip package having a substrate with contact pads and aperture. After solder bonding input/output pads to the array of contact pads, a high viscosity epoxy is flowed under pressure through the aperture to fill the space between the semiconductor die and the substrate. U.S. Pat. Nos. 6,369,449 and 6,573,592 are incorporated by reference in their entireties herein.

There remains, a need for the method of a flip-chip package having a chip scale perimeter that does not suffer from the disadvantages of the prior art.

BRIEF SUMMARY OF THE INVENTION

The details of one or more embodiments of the invention are set forth in the accompanying drawings and the description below. Other features, objects and advantages of the invention will be apparent from the description and drawings, and from the claims.

In accordance with a first embodiment of the invention, there is provided a method for the manufacture of a package to encapsulate at least one integrated circuit device. This method includes the steps of: (1) providing a dielectric substrate having a first plurality of bond pads formed on a first side thereof and at least one aperture; (2) electrically interconnecting the integrated circuit device to the plurality of bond pads forming a substrate/integrated circuit device assembly; (3) gravitationally aligning the substrate/integrated circuit assembly such that the integrated circuit device is lower than said substrate; (4) introducing a volume of a low viscosity dielectric into the at least one aperture, wherein the volume is effective to coat a surface of the integrated circuit device and substantially fill the at least one aperture; and (5) encapsulating the integrated circuit device and the first side of said substrate with a dielectric polymer.

In accordance with a second embodiment of the invention, there is provided a package encasing at least one integrated circuit device. This package includes a dielectric substrate having a first plurality of bond pads formed on a first side thereof and a second plurality of bond pads from on a second side thereof. The dielectric substrate further has an aperture extending therethrough. At least one integrated circuit device having input/output pads is directly soldered to the first plurality of bond pads and a first polymer encapsulates the integrated circuit device and the first side of the substrate. A second polymer is disposed between the integrated circuit device and the first side of the substrate and substantially fills the aperture, where a first spacing between the integrated circuit device and the first side of the substrate is less than 100 microns and a second spacing between a sidewall of the integrated circuit device and a sidewall of the substrate is less than 2 millimeters.

BRIEF DESCRIPTION OF THE DRAWINGS

Like reference numbers and designations in the various drawings indicated like elements.

DETAILED DESCRIPTION

Figure 1:
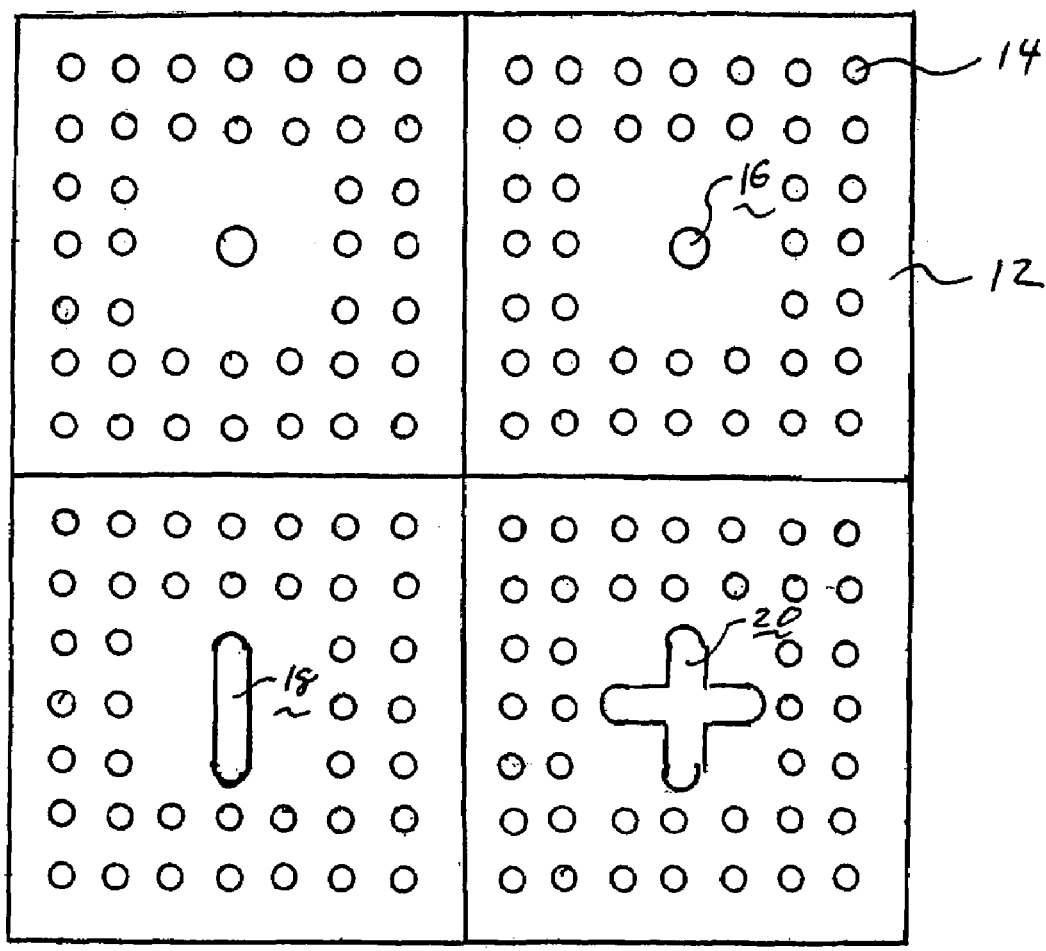
FIG. 1 is a top planar view of a substrate used in the method of the invention.

FIG. 1 shows a panel 10 containing a plurality of substrates 12 for use in the manufacture of a flip chip integrated circuit package in accordance with an embodiment of the invention. The substrate is formed from any suitable dielectric material such as FR-4, a flame resistant epoxy material. A first side of the substrate contains a first plurality of bond pads 14. The bond pads are metallized to be electrically conductive and wettable by the solder employed for the flip-chip bond. Typically, this solder is a lead-based or lead-free eutectic. The first plurality of bond pads 14 are arranged in an array to match an array of input/output pads on an electrically active face of an integrated circuit die. At least one aperture 16 extends through the substrate 12. As described hereinbelow, the aperture 16 functions as a gate to introduce a low viscosity underfill between the substrate 12 and the integrated circuit device. The number of apertures, the shape of the apertures and the cross-sectional area of the apertures are selected to facilitate rapid underfill based on the size and shape if the integrated circuit device. For example, for a standard square integrated circuit die, an aperture with a circular cross-section, as shown at reference numeral 16, is suitable. For a rectangular die, a slotted aperture 18 is preferred and for relatively large die, that is having a length and width in excess of 15 square millimeters, a cruciform, or X-shaped, aperture 20 is preferred.

Figure 2A:
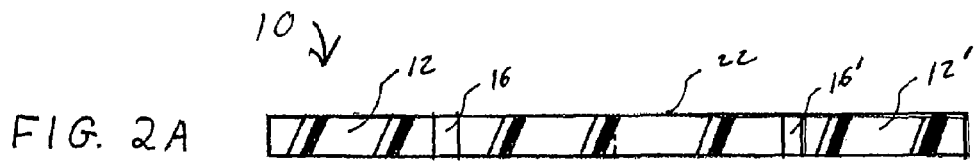
FIGS. 2A-2E illustrate the method of the invention in cross-sectional representation.

FIGS. 2A through 2E illustrate in cross-sectional representation a method for manufacturing a flip chip package in accordance with the invention. FIG. 2A illustrates a portion of the panel 10 including substrates 12 and 12' and apertures 16 and 16'. The first array of bond pads formed on first surface 22 of the substrates 12, 12' are not shown.

Figure 2B:
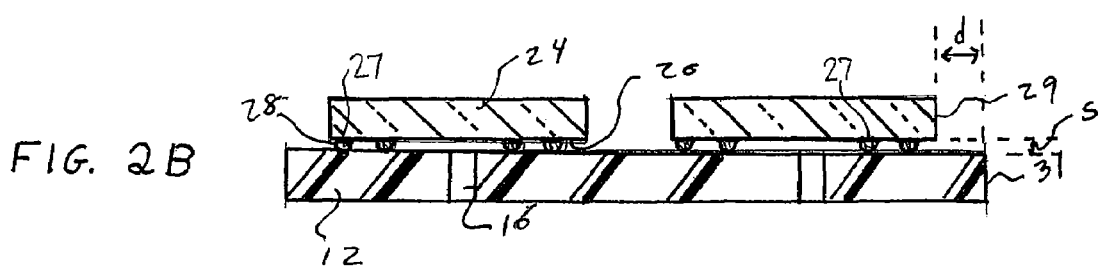

Referring to FIG. 2B, an integrated circuit device 24 has an electrically active face 26 that includes a plurality of metallized, electrically active, input/output pads 27 in a pattern that matches the pattern of the first plurality of bond pads of the substrate 12. The input/output pads 27 of the integrated circuit device 24 are soldered directly to the first plurality of bond pads by solder bumps 28 forming a substrate/integrated circuit device assembly. To approach a chip scale package, a distance, d, between a sidewall 29 of the integrated circuit device 24 and a sidewall 31 of the substrate 12 is less than 2 millimeters. Preferably, the distance, d, is from one to two millimeters. The interface between underfill and plastic molding resin is a common initiation point for package delamination. Limiting the amount of underfill material should reduce delamination, improving package reliability.

A spacing, s, between the electrically active face 26 of the integrated circuit device 24 and the first surface 22 of the substrate 12 is less than 100 microns and preferably from 65 to 90 microns. Aperture 16 is disposed on the substrate 12 to be centrally located on the substrate/integrated circuit device assembly.

Figure 2C:
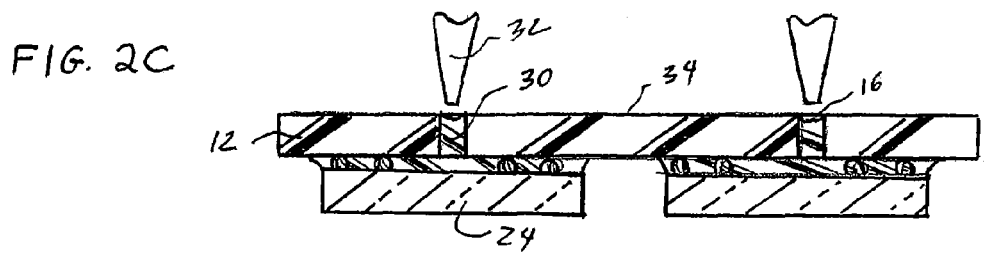

As shown in FIG. 2C, the substrate/integrated circuit device assembly is then positioned such that gravity will cause a low viscosity dielectric 30 introduced into the aperture 16, such as by dispensing needle 32, to flow from a second surface 34 of the substrate 12. Both gravity and capillary action facilitate the flow of the low viscosity dielectric 30 and extraordinary means such as vacuum assist are not required. The low viscosity dielectric has a pre-cure room temperature viscosity of less than 80 pascal second (Pa.s). More preferably, the pre-cure viscosity is from 8 Pa.s to 60 Pa.s. One suitable material for the low viscosity dielectric is a capillary flow type material, such as U8437-2 from Namics Technologies, Inc. of Santa Clara, Calif. which has a nominal pre-cure viscosity of 40 Pa.s.

Since the low viscosity dielectric 30 flows from a central position of the integrated circuit device 24 and outward therefrom, air readily escapes outward from the meniscus of the low viscosity dielectric and voids do not form. The low viscosity dielectric flows across the integrated circuit device 24 in all directions, rather than one or two directions in the prior art, shortening the flow path of the low viscosity dielectric improving the units per hour that may be coated with the underfill. Subsequent to deposition of the low viscosity dielectric 30, the viscosity is increased to prevent additional flow by curing. One suitable cure process is pre-heating the substrate to a temperature of between 90° C. and 120° C. At this temperature, the low viscosity dielectric 30 has a viscosity of less than 1 Pa.s. Following deposition of the low viscosity dielectric 30, it is pre-cured at the same temperature of 90° C. to 120° C. and then oven cured to harden the dielectric material. A suitable oven cure is 145° C. to 165° c. for from 60 minutes to 120 minutes.

The method also provides good control of the underfill coverage of about 0.5 millimeter thereby allowing smaller die to package clearance, on the order of two millimeters or less per side, and preferably with a side clearance of between 0.5 millimeter and 1 millimeter. This greatly enhances the drive to chip scale packaging.

Since the aperture 16 functions as a gate for the introduction of the low viscosity dielectric, sufficient space is required at the surface of the integrated circuit device 24 underlying the aperture 16. This may or may not decrease the number of input/output pads that may be bonded to the substrate 12.

Figure 2D:
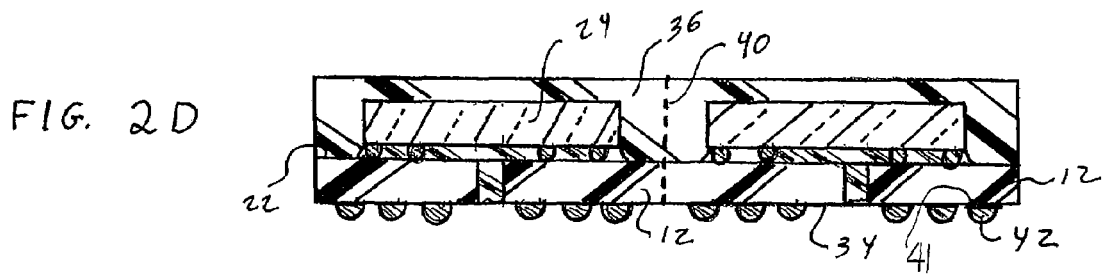
Figure 2E:
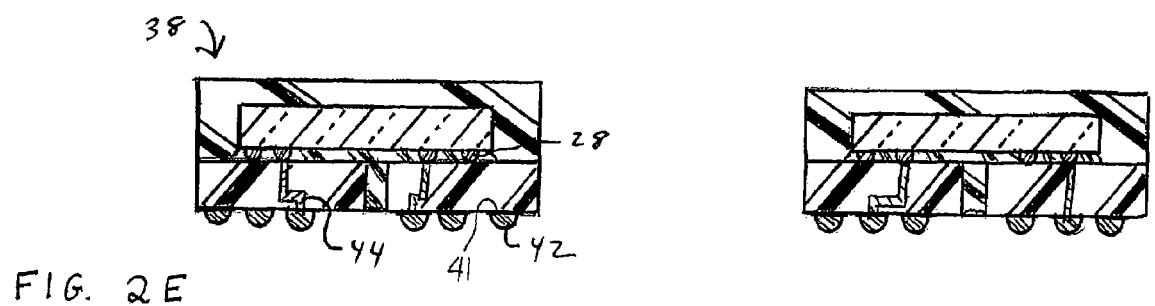

The low viscosity dielectric 30 is then cured by heating to a temperature of from 145° C. to 165° C. for from 60 minutes to 120 minutes to increase the room temperature viscosity. With reference to FIG. 2D, the substrate/integrated circuit device assembly is then placed in a suitable mold and the integrated circuit device 24 and first side 22 of the substrate 12 encapsulated with a suitable dielectric polymer 36 such as a thermosetting epoxy.

If the substrate 12 were originally a portion of a panel, an individual package (38 in FIG. 2E) is formed by singulating the panel such as a long saw line 40. Either before or after singulation, solder balls 42 may be attached to a second plurality of bond pads 41 formed on the second surface 34 of the substrate 12. Electrically conductive vias 44 electrically interconnect solder balls 42 and solder bumps 28. Solder balls 42 are positioned to align with an array of bond pads formed on a printed circuit board or other external circuitry.

While a method for the manufacture of package encapsulating a single integrated circuit device is described, the method is equally suitable for large packages having multiple integrated circuit devices, such as a hybrid package. While the method for the manufacture discloses encapsulating the integrated circuit device and substrate with a plastic molding resin, the method is equally suitable fro bare die applications which do not utilize encapsulation with a molding resin.

One or more embodiments of the present invention have been described. Nevertheless, it will be understood that various modifications may be made without departing from the spirit and scope of the invention. For example, other types of semiconductor packages including pad grid array packages, pin grid array packages and leaded packages could be manufactured. Accordingly, other embodiments are within the scope of the following claims.

What is claimed is:

1. A method for the manufacture of a package to encapsulate at least one integrated circuit device, comprising the steps of:
   (a) providing a dielectric substrate having a first side and a second side opposite the first side and having a first plurality of bond pads formed on the first side thereof and having at least one aperture;
   (b) electrically interconnecting said integrated circuit device to said plurality of bond pads forming a dielectric substrate/integrated circuit device assembly where the at least one aperture is located centrally with respect to the integrated circuit device;
   (c) gravitationally aligning said dielectric substrate/integrated circuit assembly such that said integrated circuit device is beneath said dielectric substrate;
   (d) introducing a volume of a low viscosity dielectric, having a pre-cure room temperature viscosity of less than 80 pascal seconds (Pa-s), into said at least one aperture by a dispenser vertically in alignment with the at least one aperture, so that the low viscosity dielectric flows from the at least one aperture downward to a central position of the integrated circuit device and outward therefrom;
   (e) subsequently increasing the viscosity of the low viscosity dielectric by curing, said curing including
      (1) pre-curing at a temperature between 90° C. and 120° C. and
      (2) subsequently curing at a second temperature between 145° C. and 165° C. for a period between 60 minutes and 120 minutes,
   wherein said volume is effective to coat a surface of said integrated circuit device, the volume being selected to control a lateral extent of coverage of said surface to within about 0.5 millimeter so that a side clearance between a sidewall of the device and a sidewall of the dielectric substrate is between 0.5 millimeter and 1 millimeter, and fill said at least one aperture to a level not higher than the second side of the dielectric substrate, so that more than half of the volume of the at least one aperture is filled, in accordance with flow of said low viscosity dielectric.

2. The method of claim 1 wherein input/output pads on a face of said integrated circuit device are soldered directly to said first plurality of bond pads.

3. The method of claim 2 wherein a spacing between said integrated circuit device and said first side of said dielectric substrate is from 50 microns to 100 microns.

4. The method of claim 3 wherein said pre-cure room temperature viscosity is from 8 Pa-s to 60 Pa-s.

5. The method of claim 1 further including the step of:
   (f) encapsulating said integrated circuit device and said first side of said dielectric substrate with a dielectric polymer.

6. The method of claim 5 including selecting said low viscosity dielectric to be capillary flow type material.

7. The method of claim 6 wherein in step (f), said integrated circuit device and said first side of said dielectric substrate are encapsulated with a plastic molding compound.

8. The method of claim 5 wherein said first plurality of bond pads forms an array of bond pads that is separated following said step (f).

9. The method of claim 1 wherein said at least one aperture has a shape and cross sectional area in accordance with the size and shape of said integrated circuit device.

10. The method of claim 9 wherein said integrated circuit device has a square shape, and said at least one aperture is selected to have a circular cross-sectional area.

11. The method of claim 9 wherein said integrated circuit device has a rectangular shape, and said at least one aperture is selected to have a slot-shaped cross-sectional area.

12. The method of claim 9 wherein said integrated circuit device has a rectangular shape in excess of 15 square millimeters, and said at least one aperture is selected to have a cruciform-shaped cross-sectional area.

* * * * *